United States Patent
Mirotchnik et al.

(10) Patent No.: US 6,794,864 B2
(45) Date of Patent: Sep. 21, 2004

(54) DETERMINATION OF OIL AND WATER COMPOSITIONS OF OIL/WATER EMULSIONS USING LOW FIELD NMR RELAXOMETRY

(75) Inventors: Konstantin Mirotchnik, Calgary (CA); Kevin Allsopp, Calgary (CA); Apostolos Kantzas, Calgary (CA); Daniel Marentette, Calgary (CA)

(73) Assignee: University Technologies International Inc., Calgary (CA)

( * ) Notice: Subject to any disclaimer, the term of this patent is extended or adjusted under 35 U.S.C. 154(b) by 125 days.

(21) Appl. No.: 09/852,339

(22) Filed: May 11, 2001

(65) Prior Publication Data

US 2003/0009297 A1 Jan. 9, 2003

(30) Foreign Application Priority Data

Mar. 26, 2001 (CA) .............................. 2342007

(51) Int. Cl.[7] .............................................. G01V 3/00
(52) U.S. Cl. .................... 324/306; 324/303; 324/307
(58) Field of Search ................................ 324/303, 300, 324/306, 307, 309

(56) References Cited

U.S. PATENT DOCUMENTS

| 4,782,295 A | 11/1988 | Lew |
| 4,785,245 A | 11/1988 | Lew et al. |
| 4,901,018 A | 2/1990 | Lew |
| 5,216,366 A | 6/1993 | Young |
| 5,684,399 A | 11/1997 | Bayer |
| 6,107,796 A * | 8/2000 | Prammer ................... 324/303 |
| 6,140,817 A * | 10/2000 | Flaum et al. ............... 324/303 |
| 2002/0167314 A1 * | 11/2002 | Prammer ................... 324/303 |
| 2003/0009297 A1 * | 1/2003 | Mirotchnik et al. .......... 702/25 |

FOREIGN PATENT DOCUMENTS

| DE | 4119711 | 12/1992 |
| EP | 0 496 330 A2 | 7/1992 |

OTHER PUBLICATIONS

Fairbrother et al., article "Measurement of oil in French dressing by Medium–resolution, proton magnetic resonance spectroscopy" Lab. Chim. Anal., Inst. Natl Agron., Paris, 75231, Fr. Analusis (1993), 21(2), 113–117.*

* cited by examiner

Primary Examiner—Diego Gutierrez
Assistant Examiner—Tiffany A. Fetzner
(74) Attorney, Agent, or Firm—Bennett Jones LLP

(57) ABSTRACT

A method and apparatus for determining the oil and water content of a heavy oil and water emulsion includes a low field NMR spectrometer and means for determining the total amplitude of an NMR spectrum at specified $T_2$ values.

11 Claims, 4 Drawing Sheets

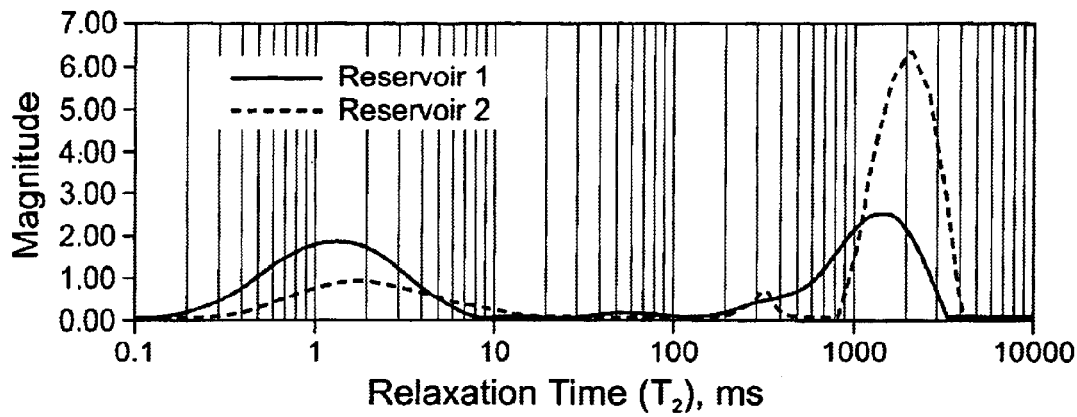
FIG. 1 NMR Spectra of Stable Emulsions
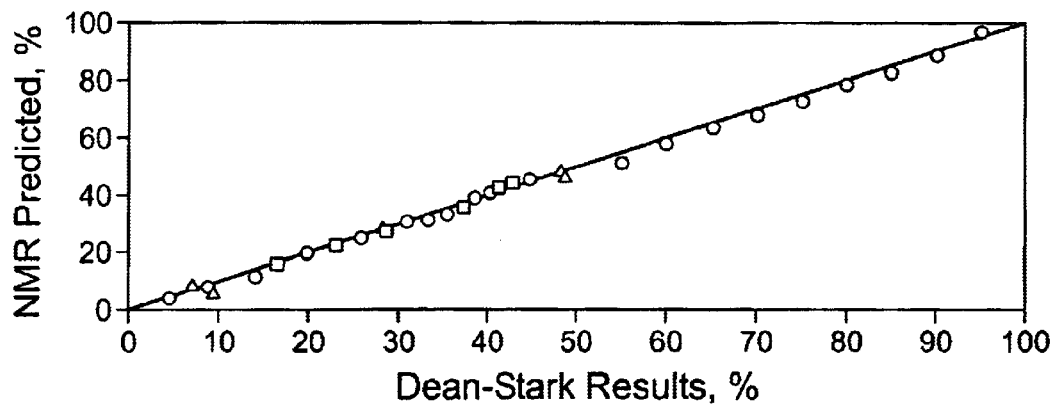
FIG. 2 Water Content Prediction in Water-Oil Mixtures
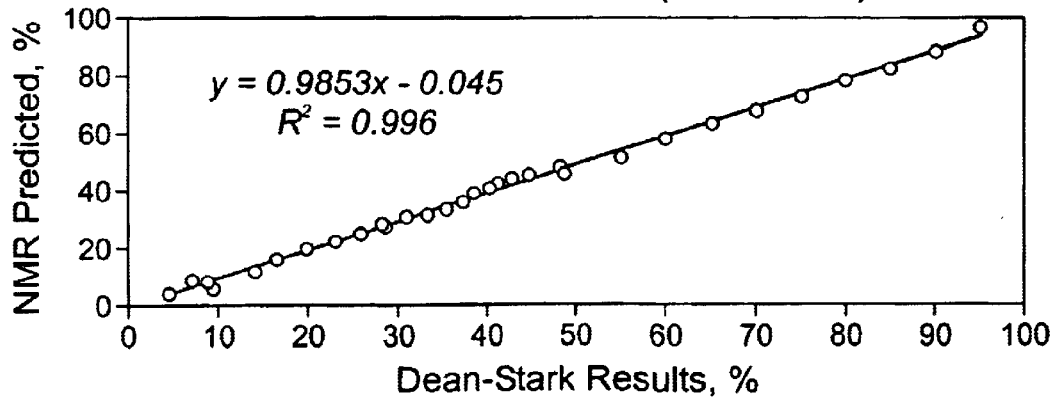
FIG. 3 Correlation for Water Content Prediction in Water-Oil Mixtures (Reservoir 1)
$y = 0.9853x - 0.045$
$R^2 = 0.996$

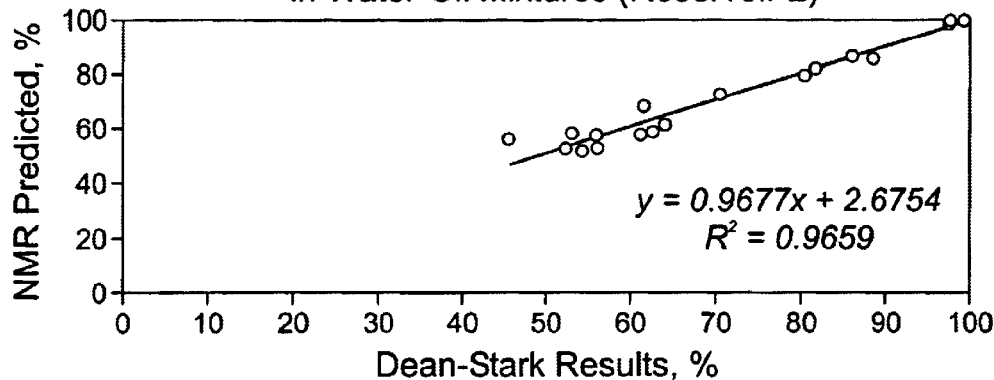
FIG. 4 Correlation of Water Content Prediction in Water-Oil Mixtures (Reservoir 2)
$y = 0.9677x + 2.6754$
$R^2 = 0.9659$
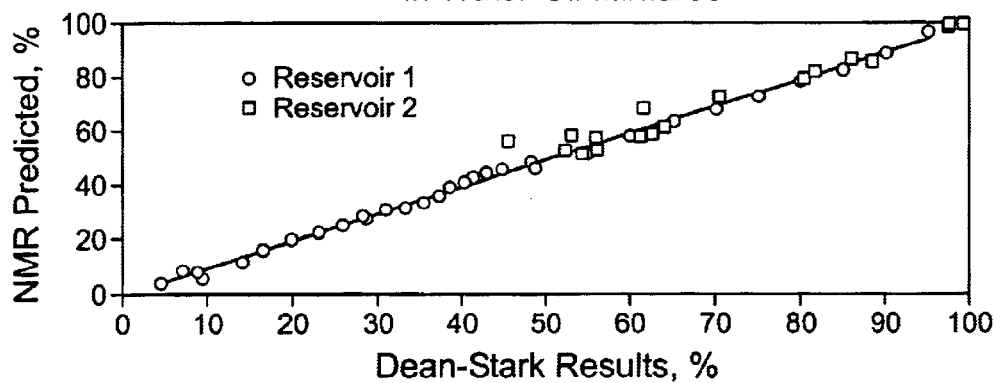
FIG. 5 Correlation for Water Content Prediction in Water-Oil Mixtures
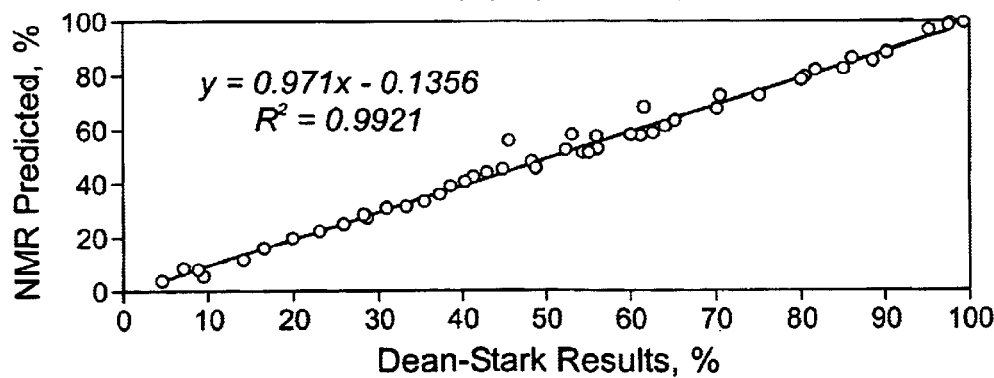
FIG. 6 Correlation for Water Content Prediction in Water-Oil Mixtures
$y = 0.971x - 0.1356$
$R^2 = 0.9921$

US 6,794,864 B2

DETERMINATION OF OIL AND WATER COMPOSITIONS OF OIL/WATER EMULSIONS USING LOW FIELD NMR RELAXOMETRY

PRIORITY CLAIM

This application claims the priority benefit of Canadian Patent Application No. 2,342,007 filed on Mar. 26, 2001 as file no. 45074.9 and entitled Determination of Oil and Water Compositions of Oil/Water Emulsions Using Low Field NMR Relaxometry.

FIELD OF THE INVENTION

The present invention relates to methods and apparatuses for determining oil and water compositions of heavy oil/water emulsions using low field NMR relaxometry.

BACKGROUND OF THE INVENTION

Low field Nuclear Magnetic Resonance (NMR) relaxometry techniques have been developed in the laboratory to enhance and support comparable NMR logging tools that are currently used downhole. Low field NMR relaxometry involves relaxometers operating at about 2 Mhz or less. Low field NMR relaxometry has shown that discrimination of water and oil saturation in core and ore can be easily determined. In such cases the NMR can detect the total water weight fraction and the total oil weight fraction, the viscosity of the oil, the amount of bound or mobile water and the amount of mobile or bound oil.

One particular problem is the determination of oil and water content of specific hydrocarbon streams. Of particular interest are the streams that contain heavy oil in emulsified fluids (water-in-oil or oil-in-water emulsions) which are currently very common in thermal production operations and are very difficult to handle. Test separators are currently used as the standard way of measuring the flow of thermally produced wells such as cyclic steam stimulation (CSS), steam assisted gravity drainage (SAGD) and steam flooding wells. The test separators are inherently incapable of measuring emulsified flow. Other probe-type devices suffer from inaccuracies related to the presence of solids or gas, salinity, temperature, velocity, emulsion type, and range of cut.

Therefore, there is a need in the art for methods and apparatuses to discriminate quickly, accurately and precisely the amount of heavy oil or bitumen and water in an emulsified fluid stream.

SUMMARY OF THE INVENTION

The present invention is based on the discovery that the NMR spectra of an emulsified mixture of heavy oil or bitumen and water consists of two sets of $T_2$ relaxation peaks. At the specific temperature of 30° C., the water peaks are typically in the range of 10 to 3000 milliseconds while the oil/bitumen peaks are typically in the range of 0.2 to 10.0 milliseconds. The ranges of these peaks may be affected by the degree of emulsification or separation of the hydrocarbon and aqueous phases, the temperature and the presence of additives. The spectrum of the oil/bitumen component diminishes at lower temperatures and may not be completely recovered at relatively lower temperatures.

Therefore, in one aspect of the invention, there is provided a method of determining the oil fraction of a fluid emulsion comprising heavy oil/bitumen and water by direct measurement comprising the steps of:

(a) providing a low field NMR relaxometer;
(b) measuring and recording the $T_2$ relaxation spectrum of the emulsion at a temperature allowing recovery of the $T_2$ spectrum of the heavy oil/bitumen, substantially separate from a $T_2$ water peak;
(c) determining a distinguishing $T_2$ cutoff value;
(d) measuring the total amplitude ($A_{oil}$) of the spectrum at $T_2$ times less than and equal to the $T_2$ cutoff value;
(e) converting $A_{oil}$ to a weight value by dividing $A_{oil}$ by the amplitude index of an oil standard ($Al_{oil}$) of known weight; and
(f) using the weight value to determine the oil fraction of the fluid emulsion.

In another aspect, the invention comprises a method of determining the water fraction of a fluid emulsion comprising heavy oil/bitumen and water by direct measurement comprising the steps of:

(a) providing a low field NMR relaxometer;
(b) measuring and recording the $T_2$ relaxation spectrum of the emulsion
(c) determining a distinguishing $T_2$ cutoff value;
(d) measuring the total amplitude ($A_w$) of the spectrum at $T_2$ times greater than the $T_2$ cutoff value;
(e) converting $A_w$ to a weight value by dividing $A_w$ by the amplitude index of a water standard ($Al_w$) of known weight; and
(f) using the weight value to determine the water fraction.

In another aspect, the invention comprises an apparatus determining by direct measurement the oil fraction of a flowing fluid emulsion comprising heavy oil/bitumen and water comprising:

(a) a low field NMR relaxometer having a NMR magnet positioned in proximity to a channel through which the emulsion flows, said relaxometer for measuring the $T_2$ spectrum of a sample, at a temperature allowing recovery of the $T_2$ spectrum of the heavy oil/bitumen, substantially separate from a $T_2$ water peak;
(b) means for identifying a distinguishing $T_2$ cutoff value;
(c) means connected to the relaxometer for measuring total $T_2$ amplitude below the $T_2$ cutoff value, wherein a substantial portion of the spectrum attributable to the oil is at $T_2$ values less than or equal to the $T_2$ cutoff value;
(d) means for converting the total $T_2$ amplitude value to a weight value; and
(e) means for determining the weight value to determine the oil fraction of the fluid emulsion.

In yet another aspect, the invention comprises an apparatus determining by direct measurement the oil fraction of a fluid emulsion comprising heavy oil/bitumen and water comprising:

(a) means for obtaining a sample of the emulsion;
(b) a low field NMR relaxometer measuring the $T_2$ spectrum of the sample at a temperature allowing recovery of the $T_2$ spectrum of the heavy oil/bitumen, substantially separate from a $T_2$ water peak;
(c) means for identifying a distinguishing $T_2$ cutoff value;
(d) means connected to the relaxometer for measuring total $T_2$ amplitude below the $T_2$ cutoff value, wherein a substantial portion of the spectrum attributable to the oil is at $T_2$ values less than or equal to the $T_2$ cutoff value;
(e) means for converting the total $T_2$ amplitude value to a weight value; and (f) means for determining the weight value to determine the oil fraction of the fluid emulsion.

In another aspect, the invention comprises a method of determining by direct measurement the oil fraction and water fraction of a fluid emulsion comprising heavy oil/bitumen and water comprising the steps of:

(a) providing a low field NMR relaxometer;

(b) measuring and recording the $T_2$ relaxation spectrum of the emulsion at a temperature allowing recovery of the $T_2$ spectrum of the heavy oil/bitumen, substantially separate from a $T_2$ water peak;

(c) determining a distinguishing $T_2$ cutoff value;

(d) measuring the total amplitude ($A_{oil}$) of the spectrum at $T_2$ times less than and equal to the $T_2$ cutoff value;

(e) converting $A_{oil}$ to a weight value by dividing $A_{oil}$ by the amplitude index of an oil standard ($AI_{oil}$) of known weight;

(f) measuring the total amplitude ($A_w$) of the spectrum at $T_2$ times greater than the $T_2$ cutoff value;

(g) converting $A_w$ to a weight value by dividing $A_w$ by the amplitude index of a water standard ($AI_w$) of known weight; and (h) using the oil weight value and the water weight value to determine the oil fraction and water fraction respectively.

BRIEF DESCRIPTION OF THE DRAWINGS

The invention will now be described by way of exemplary embodiments with reference to the accompanying drawings. In the drawings:

FIG. 1 shows a typical NMR $T_2$ spectra from two different emulsions.

FIG. 2 shows the comparison of NMR predicted water content vs. Dean-Stark measured water content for three different batches of samples form reservoir 1.

FIG. 3 shows the same results as FIG. 2 but are grouped and the trend-line is plotted.

FIG. 4 shows the comparison of the NMR predicted data and the Dean-Stark measurement data for three samples of reservoir 2.

FIG. 5 shows a comparison of the results of reservoir 1 and reservoir 2.

FIG. 6 shows the same results as Figure but are grouped and the common trend-line is plotted.

DETAILED DESCRIPTION OF THE INVENTION

Figure 7:
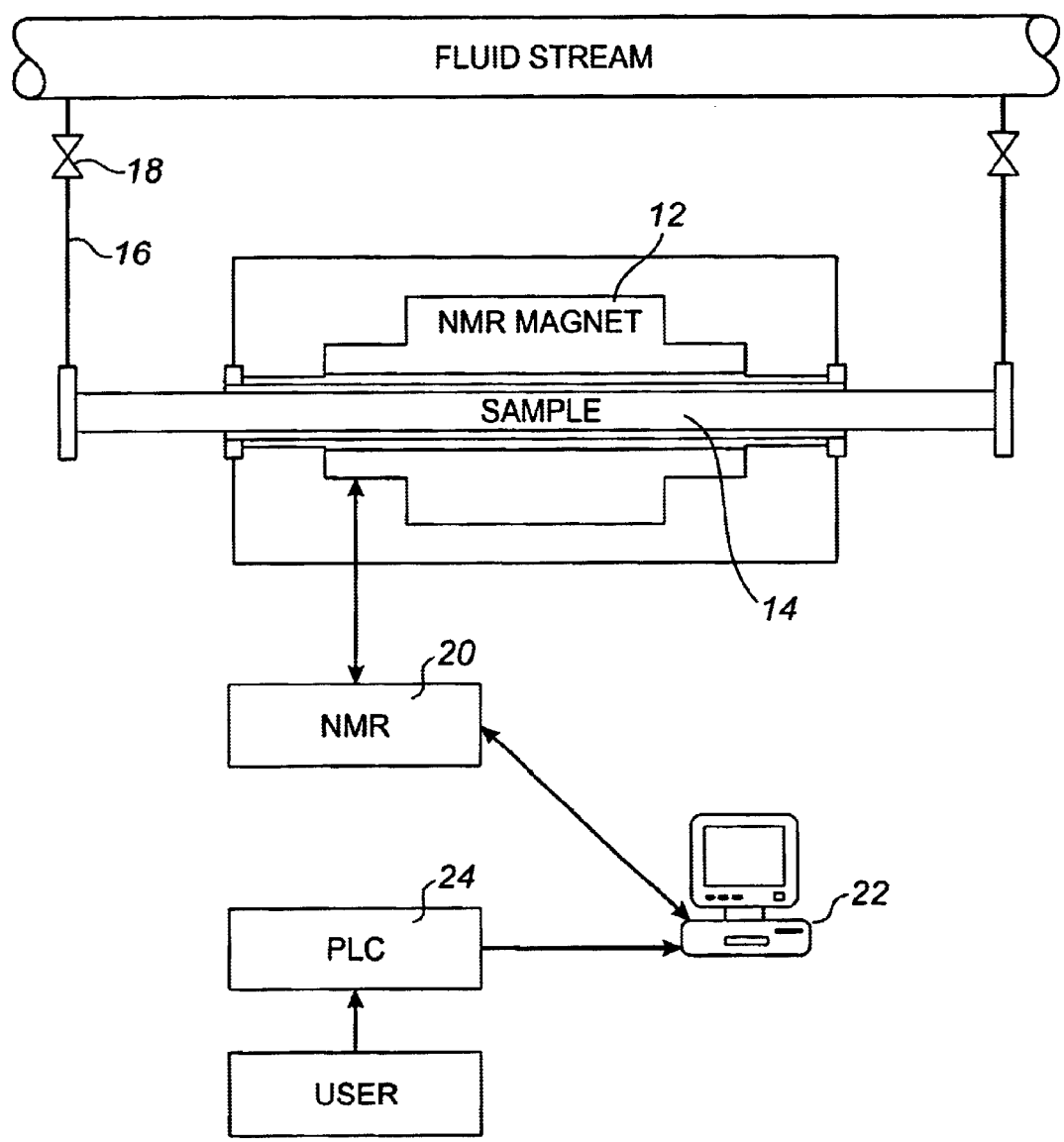
FIG. 7 is a schematic representation of one embodiment of the apparatus of the present invention.

The present invention provides for a method and apparatus for determining the oil content or water content, or both oil content and water content, of a fluid emulsion comprising heavy oil and water. The invention is equally applicable to oil-in-water emulsions or water-in-oil emulsions, whether or not solids, gases or other impurities are present and regardless of the range of oil or water content in the emulsion.

When describing the present invention, the following terms have the following meanings, unless indicated otherwise. All terms not defined herein have their common art-recognized meanings.

A. Definitions

"AI" or "amplitude index" refers to the amplitude of NMR signal for one gram of oil or water at surface temperature and atmospheric pressure.

"Bitumen" refers to hydrocarbon crude oil normally of viscosity >100,000 cp at room temperature and/or API gravity <10.

"CPMG" refers to the Curr-Purcell-Meiboom-Gill pulse echo method used by NMR tools to measure $T_2$.

"Emulsion" refers to mixtures of oil and water where one liquid is dispersed in the other liquid as discrete droplets. As used herein, the term "emulsion" may also refer to mixtures of oil and water where only a portion of the mixture is an emulsion and the remainder comprises oil and water as separate phases.

"Heavy oil" refers to hydrocarbon crude oil normally of viscosity >20 cp at room temperature and/or API gravity >10 and <20.

"HI" or "hydrogen index" refers to the relative proton density of a sample. The strength or amplitude of a signal is therefore proportional to the the amount of hydrogen in the sample. The HI of pure water at surface temperature and pressure is 1. The HI is proportional to water concentration found in the Concentrative Properties of Aqueous Solutions table for sodium chloride in the CRC Handbook of Chemistry and Physics (1982). As used herein, HI is used interchangeably with AI above.

"NMR" refers to Nuclear Magnetic Resonance which is the technology that uses a magnetic field to influence and measure nuclei spins of certain elements.

"TE" refers to Time Echo [ms]. This is the time-to-echo time. It is defined as the "delay" between pulses.

"$T_2$" refers to the transverse relaxation time measured in milliseconds.

B. Description

All NMR measurements were performed using a Numar Corespec1000™ relaxometer. Equivalent or alternative relaxometers are well-known in the art. $T_2$ measurements were made using the CPMG techniques which are well known in the art. The NMR magnet set-up was at 30° C. The relaxometer was tuned twice per day and tuning was done using a sealed standard sample (permanent amount of doped water with $T_2$~240 ms) and a standard tuning procedure.

The NMR spectra of a mixture of heavy oil or bitumen with water consist of two sets of $T_2$ relaxation peaks. The water peaks are typically in the range of 10–3000 ms, while the oil/bitumen peaks are typically in the range of 0.2–10 ms at the specific temperature of 30° C. The $T_2$ cutoff value is that value which substantially separates the water peaks from the oil/bitumen peaks. In this case, the $T_2$ cutoff value is about 10 milliseconds. The appropriate cutoff value value for any given application may be determined empirically. Alternatively, a variable such as process temperature may be varied to achieve a desired cutoff value value. The degree of emulsification or separation of the phases, in addition to the temperature and the presence of additives affects the ranges of these peaks. If the spectrum of a mixture is taken at a relatively low temperature, then the complete spectrum of the oil/bitumen may not be recovered.

If a known amount of a heavy oil (or bitumen) and water mixture is placed in the NMR, then the spectrum obtained can be deciphered in the spectra of the individual phases. The total obtained signal amplitude is compared to that of the same amount of a sample that only contains water (standard). If the amplitude of the water standard is $A_{sw}$ and the amplitude of the water content of the unknown sample is $A_w$, then the water fraction $W_w$ of the unknown sample is $$W_w = A_w / AI_w$$

$$A_w = \Sigma A_j, j > 10 \text{ ms}$$

where $AI_w$ is the amplitude index of water standard of weight $W_{sw}$ ($AI_w = A_{sw}/W_{sw}$) and $\Sigma A_j, j > 10$ ms is the sum of the amplitudes of the sample spectrum above the $T_2$ cutoff value of 10 ms. The amount of heavy oil or bitumen $W_{oil}$ may then be determined by difference if there is not a significant amount of solids or gas in the sample:

$$W_{oil} = 1 - W_w$$

This is the simplest way to calculate water and heavy oil content in any unknown sample of a known weight.

If the whole spectrum of the liquids is obtained, then the heavy oil fraction $W_{oil}$ can be obtained through a similar equation as the water content as long as the amplitude of the heavy oil spectrum $A_{oil}$ is corrected for its Amplitude Index ($AI_{oil}$) at a given temperature. The following equations apply:

$$W_{oil} = A_{oil} / AI_{oil}$$

$$A_{oil} = \Sigma A_j, j \leq 10 \text{ ms}$$

where $AI_{oil}$ is the amplitude index of a bitumen standard of weight $W_{s\,oil}$ ($AI_{oil} = A_{s\,oil}/W_{s\,oil}$) and $\Sigma A_j, j \leq 10$ ms is the sum of the amplitudes of the sample spectrum below or equal to the $T_2$ cutoff value of 10 ms. This second equation is valuable when the weight of the sample is not known or there is suspicion of solids or gas present in the stream.

The fact that oil and water contents are estimated from the individual spectra components provides a set of measurements that are independent of the presence of gas or solids. This is because both gas and solids such as entrained sand do not contribute to the measured spectra.

However, when these types of measurements are attempted in the presence of solids and/or gas, it is important to capture the complete spectrum of the oil. This is achieved by adjusting the temperature at which the measurements are taken. In general, an optimum temperature can be found in the range of 20–80° C. that can be tailored for application in specific reservoirs.

The present invention also relates to an apparatus for performing the operations disclosed herein. In one embodiment, the invention comprises a NMR based system for direct measurement of water and oil fractions. The system is designed to operate using slipstreams for the measurement of spectra of flowing streams on-line. In one embodiment, the system allows for automatic sampling from a flowing stream and the measurement is taken from the discrete sample. One embodiment of such a system is shown schematically in FIG. 7. A NMR magnet (12) is placed adjacent the sample chamber (14) of known volume. The sample is taken from the fluid stream by a tap (16) including valve (18). The NMR spectrometer (20) is operatively connected to a processor (22) which may be a general purpose computer programmed with appropriate software. The processor (22) comprises the means for implementing the methods disclosed herein with the NMR data received from the spectrometer (20) and also controls the spectrometer (20). Alternatively, the processor (22) may comprise programmable firmware, electronic circuits or other hardware, or combination of hardware and software, known to those skilled in the art. The system may be controlled by a programmed logic controller (24) as is well known in the art.

Figure 8:
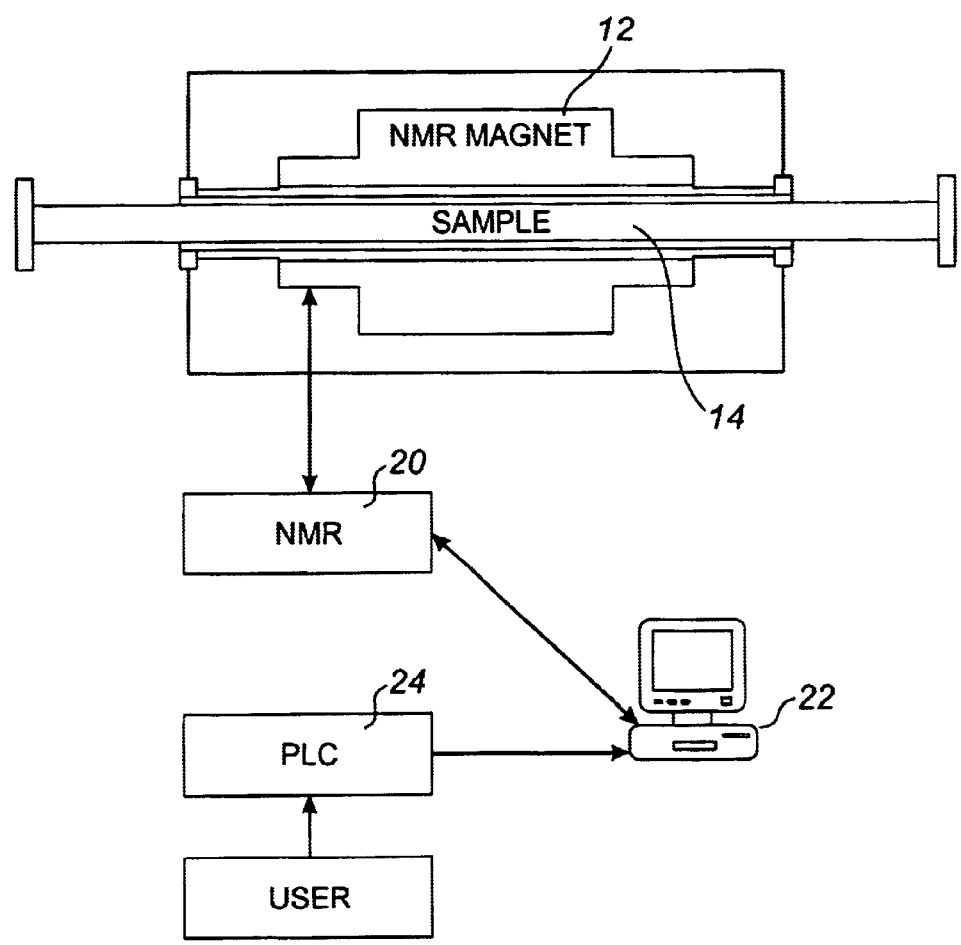
FIG. 8 is a schematic representation of an alternative embodiment of the apparatus of the present invention.

Alternatively, the system may be configured to measure a flowing stream without the need to capture a sample and hold it. FIG. 8 illustrates schematically one embodiment of a system configured to measure a flowing stream.

As shown in FIG. 8, a NMR magnet (12) is placed directly adjacent the fluid stream. The NMR spectrometer (20) is operatively connected to a processor (22). The processor (22) comprises the means for implementing the methods disclosed herein with the NMR data received from the spectrometer (20) and also controls the spectrometer (20). The system may be controlled by a programmed logic controller (24) as is well known in the art.

In either embodiment, the sample pipe need not be full for accurate measurements to be made. The water content and the heavy oil content are measured independently and the ratio determined. If the sample pipe is full with water and oil, and it is known that there are no appreciable quantities of gas or solids, then one of the water or oil phases may be measured and the other determined by difference. However, this approach is potentially more open to error caused by the presence of gas and solids in the sample stream.

C. Example

The capability of the present invention was demonstrated using samples from two different heavy oil reservoirs in Western Canada. Two different procedures were tested. For reservoir 1, a variety of samples were prepared in the laboratory. The samples had water contents that covered the full range. The samples were treated as "blinds". NMR testing was done and the water content was calculated for all samples. The samples were then placed in the Dean Stark apparatus and the water content was determined. For reservoir 2, samples were obtained from the wellhead and they were brought in the laboratory for water content and oil content determination. First NMR testing was done followed by Dean-Stark measurements to verify the NMR results.

FIG. 1 shows typical spectra from one sample from each reservoir. In both samples it can be seen that the spectra is split in two parts with a cut-off point of approximately 10 ms. The spectra are then manipulated as discussed above to provide the water and oil contents.

FIG. 2 shows the comparison of NMR predicted water content vs. Dean-Stark measured water content for three different batches of samples from reservoir 1. Although the batches were prepared at different times and were tested by different people the results fall in the same line. In FIG. 3 the same results are grouped and the trend-line is plotted. The correlation is excellent (0.996).

FIG. 4 shows the comparison of the NMR predicted data and the Dean-Stark measurement data for the samples of reservoir 2. The correlation is also excellent (0.966). FIG. 5 compares the results of reservoir 1 and reservoir 2. In FIG. 6 the same results are grouped and the common trend-line is drawn. The overall correlation is 0.992 and it is deemed excellent.

As will be apparent to those skilled in the art, various modifications, adaptations and variations of the foregoing specific disclosure can be made without departing from the scope of the invention claimed herein.

What is claimed is:

1. A method of determining the oil fraction of a fluid emulsion comprising heavy oil/bitumen and water by direct measurement comprising the steps of:

(a) providing a low field NMR relaxometer;

(b) measuring and recording the $T_2$ relaxation spectrum of the emulsion at a temperature allowing recovery of the $T_2$ spectrum of the heavy oil/bitumen, substantially separate from a $T_2$ water peak;

(c) determining a distinguishing $T_2$ cutoff value;

(d) measuring the total amplitude ($A_{oil}$) of the spectrum at $T_2$ times less than and equal to the $T_2$ cutoff value;

(e) converting $A_{oil}$ to a weight value by dividing $A_{oil}$ by the amplitude index of an oil standard ($Al_{oil}$) of known weight; and (f) using the weight value to determine the oil fraction of the fluid emulsion.

2. The method of claim 1 wherein the temperature is about 30° C. and the $T_2$ cutoff value is about 10 milliseconds.

3. A method of determining the water fraction of a fluid emulsion comprising heavy oil/bitumen and water by direct measurement comprising the steps of:

(a) providing a low field NMR relaxometer;

(b) measuring and recording the $T_2$ relaxation spectrum of the emulsion (c) determining a distinguishing $T_2$ cutoff value;

(d) measuring the total amplitude ($A_w$) of the spectrum at $T_2$ times greater than the $T_2$ cutoff value;

(e) converting $A_w$ to a weight value by dividing $A_w$ by the amplitude index of a water standard ($Al_w$) of known weight; and (f) using the weight value to determine the water fraction.

4. The method of claim 3 further comprising the steps of determining the total weight of the sample and determining the oil content of the emulsion by subtracting the water content of the sample from the total weight of the sample.

5. An apparatus determining by direct measurement the oil fraction of a flowing fluid emulsion comprising heavy oil/bitumen and water comprising:

(a) a low field NMR relaxometer having a NMR magnet positioned in proximity to a channel through which the emulsion flows, said relaxometer for measuring the $T_2$ spectrum of a sample, at a temperature allowing recovery of the $T_2$ spectrum of the heavy oil/bitumen, substantially separate from a $T_2$ water peak;

(b) means for identifying a distinguishing $T_2$ cutoff value;

(c) means connected to the relaxometer for measuring total $T_2$ amplitude below the $T_2$ cutoff value, wherein a substantial portion of the spectrum attributable to the oil is at $T_2$ values less than or equal to the $T_2$ cutoff value;

(d) means for converting the total $T_2$ amplitude value to a weight value; and (e) means for determining the weight value to determine the oil fraction of the fluid emulsion.

6. The apparatus of claim 5 wherein the $T_2$ cutoff value value is about 10 milliseconds.

7. The apparatus of claim 5 wherein the relaxometer operates at less than about 2 MHz.

8. The apparatus of claim 7 wherein the relaxometer operates at about 1 MHz.

9. The apparatus of claim 5 further comprising a heater for heating the emulsion flow.

10. An apparatus determining by direct measurement the oil fraction of a fluid emulsion comprising heavy oil/bitumen and water comprising:

(a) means for obtaining a sample of the emulsion;

(b) a low field NMR relaxometer measuring the $T_2$ spectrum of the sample at a temperature allowing recovery of the $T_2$ spectrum of the heavy oil/bitumen, substantially separate from a $T_2$ water peak;

(c) means for identifying a distinguishing $T_2$ cutoff value;

(d) means connected to the relaxometer for measuring total $T_2$ amplitude below the $T_2$ cutoff value, wherein a substantial portion of the spectrum attributable to the oil is at $T_2$ values less than or equal to the $T_2$ cutoff value;

(e) means for converting the total $T_2$ amplitude value to a weight value; and (f) means for determining the weight value to determine the oil fraction of the fluid emulsion.

11. A method of determining by direct measurement the oil fraction and water fraction of a fluid emulsion comprising heavy oil/bitumen and water comprising the steps of:

(a) providing a low field NMR relaxometer;

(b) measuring and recording the $T_2$ relaxation spectrum of the emulsion at a temperature allowing recovery of the $T_2$ spectrum of the heavy oil/bitumen, substantially separate from a $T_2$ water peak;

(c) determining a distinguishing $T_2$ cutoff value;

(d) measuring the total amplitude ($A_{oil}$) of the spectrum at $T_2$ times less than and equal to the $T_2$ cutoff value;

(e) converting $A_{oil}$ to a weight.value by dividing $A_{oil}$ by the amplitude index of an oil standard ($Al_{oil}$) of known weight;

(f) measuring the total amplitude ($A_w$) of the spectrum at $T_2$ times greater than the $T_2$ cutoff value;

(g) converting $A_w$ to a weight value by dividing $A_w$ by the amplitude index of a water standard ($Al_w$) of known weight; and (h) using the oil weight value and the water weight value to determine the oil fraction and water fraction respectively.

* * * * *